(12) United States Patent
Fang et al.

(10) Patent No.: US 11,842,420 B2
(45) Date of Patent: *Dec. 12, 2023

(54) METHOD AND APPARATUS FOR ADAPTIVE ALIGNMENT

(71) Applicant: ASML Netherlands B.V., Veldhoven (NL)

(72) Inventors: Wei Fang, Milpitas, CA (US); Lingling Pu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/659,467

(22) Filed: Apr. 15, 2022

(65) Prior Publication Data

US 2022/0245840 A1 Aug. 4, 2022

Related U.S. Application Data

(63) Continuation of application No. 16/657,897, filed on Oct. 18, 2019, now Pat. No. 11,308,635.

(Continued)

(51) Int. Cl.
*G06T 7/33* (2017.01)
*G06T 7/73* (2017.01)
(Continued)

(52) U.S. Cl.
CPC .............. *G06T 7/337* (2017.01); *G06T 7/001* (2013.01); *G06T 7/13* (2017.01); *G06T 7/74* (2017.01);
(Continued)

(58) Field of Classification Search
CPC .......... G06T 7/337; G06T 7/001; G06T 7/13; G06T 7/74; G06T 2207/10061;
(Continued)

(56) References Cited

U.S. PATENT DOCUMENTS 4,712,016 A 12/1987 Matsumura
4,962,423 A * 10/1990 Yamada ................... G03F 9/70
382/148

(Continued)

FOREIGN PATENT DOCUMENTS

TW I543294 7/2016
TW I611488 1/2018

(Continued)

OTHER PUBLICATIONS

International Search Report issued in related International Application No. PCT/EP2019/076370, dated Nov. 27, 2019 (3 pgs.).

(Continued)

*Primary Examiner* — Kathleen Y Dulaney
(74) *Attorney, Agent, or Firm* — Finnegan, Henderson, Farabow, Garrett & Dunner, LLP

(57) ABSTRACT

A method for aligning a wafer image with a reference image, comprising: searching for a targeted reference position on the wafer image for aligning the wafer image with the reference image; and in response to a determination that the targeted reference position does not exist: defining a current lock position and an area that encloses the current lock position on the wafer image; computing an alignment score of the current lock position; comparing the alignment score of the current lock position with stored alignment scores of positions previously selected in relation to aligning the wafer image with the reference image; and aligning the wafer image with the reference image based on the comparison.

20 Claims, 11 Drawing Sheets

Related U.S. Application Data

(60) Provisional application No. 62/749,566, filed on Oct. 23, 2018.

(51) Int. Cl.
*G06T 7/13* (2017.01)
*G06T 7/00* (2017.01)
*H01L 21/67* (2006.01)
*H01L 21/66* (2006.01)

(52) U.S. Cl.
CPC ........ *H01L 21/67288* (2013.01); *H01L 22/12* (2013.01); *G06T 2207/10061* (2013.01); *G06T 2207/30148* (2013.01)

(58) Field of Classification Search
CPC ............. G06T 2207/30148; G06T 7/33; H01L 21/67288; H01L 22/12
USPC .................. 382/151; 700/121; 356/237.5
See application file for complete search history.

(56) References Cited

U.S. PATENT DOCUMENTS

| | | | | |
|---|---|---|---|---|
| 7,583,833 | B2 * | 9/2009 | McIntyre | G05B 23/0264 700/121 |
| 2005/0281454 | A1 | 12/2005 | Miyashita | |
| 2006/0028645 | A1 | 2/2006 | Kawamura | |
| 2006/0126916 | A1 | 6/2006 | Kokumai | |
| 2006/0285740 | A1 * | 12/2006 | Okita | G03F 9/7003 700/110 |
| 2007/0288219 | A1 * | 12/2007 | Zafar | G03F 1/84 703/14 |
| 2008/0260234 | A1 | 10/2008 | Yamashita | |
| 2012/0241419 | A1 * | 9/2012 | Rumsby | B23K 26/355 219/121.6 |
| 2015/0029498 | A1 | 1/2015 | Guan | |
| 2015/0324965 | A1 | 11/2015 | Kulkarni | |
| 2016/0377552 | A1 * | 12/2016 | Paramasivam | H01L 21/67253 356/237.5 |
| 2018/0046096 | A1 | 2/2018 | Shibazaki | |
| 2018/0151400 | A1 | 5/2018 | Wang | |
| 2018/0238816 | A1 * | 8/2018 | Sousa | G06T 7/001 |
| 2018/0328860 | A1 * | 11/2018 | Suman | G01N 21/95607 |
| 2019/0257647 | A1 | 8/2019 | Ichinose | |
| 2019/0361363 | A1 | 11/2019 | Brauer | |
| 2020/0334446 | A1 * | 10/2020 | Fang | G06V 20/698 |

FOREIGN PATENT DOCUMENTS

| | | |
|---|---|---|
| WO | WO 91/20054 | 12/1991 |
| WO | WO 2016/149690 A1 | 9/2016 |

OTHER PUBLICATIONS

Office Action of the Intellectual Property Office of Taiwan issued in related Taiwanese Patent Application No. 108136346; dated Dec. 10, 2020 (16 pgs.).

* cited by examiner

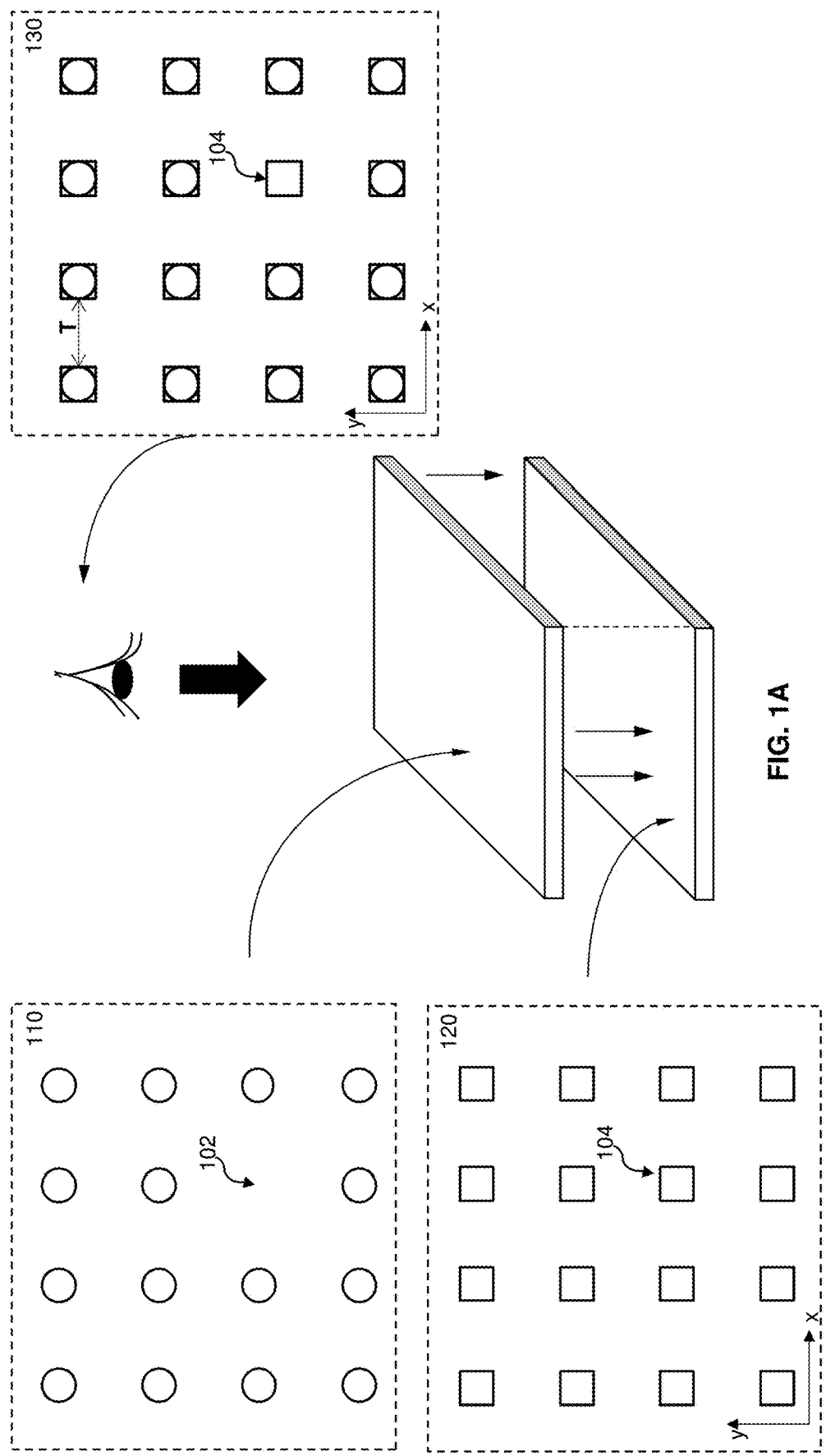

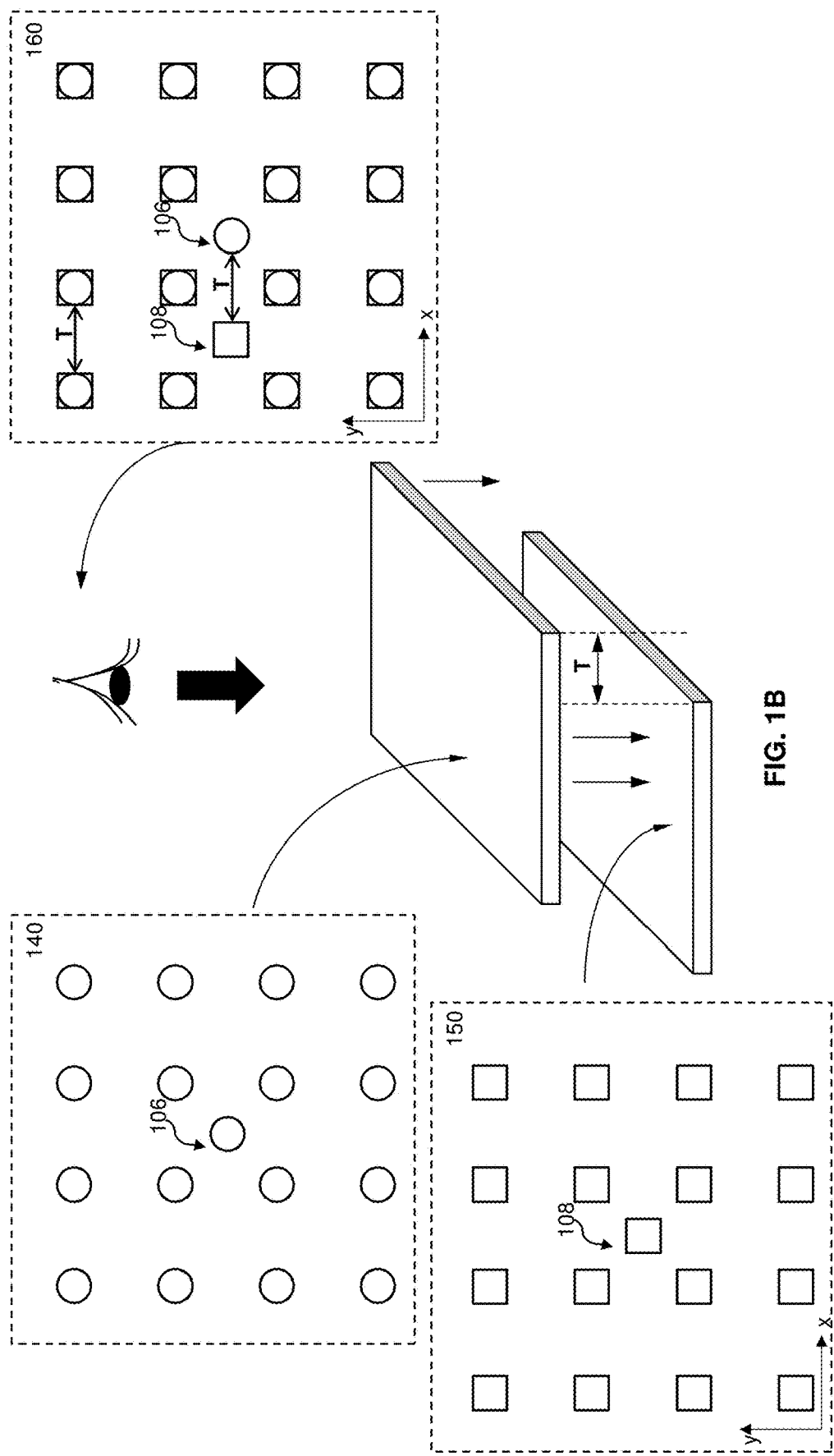

METHOD AND APPARATUS FOR ADAPTIVE ALIGNMENT

CROSS-REFERENCE TO RELATED APPLICATIONS

This application is a continuation of U.S. Non-Provisional patent application Ser. No. 16/657,897, filed on Oct. 18, 2019, which claims priority of U.S. application 62/749,566 which was filed on Oct. 23, 2018, and both of which i-s are incorporated herein by reference in their entireties.

FIELD

The embodiments consistent with the present disclosure relate generally to alignment methods, and more particularly, to an alignment method for defect detection in semiconductor fabrication operation process.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. However, imaging resolution and throughput of inspection tools struggles to keep pace with the ever-decreasing feature size of IC components. Further improvements in the art are desired.

SUMMARY

According to some embodiments of the present disclosure, there is provided a method for aligning a wafer image with a reference image. The method may comprise: searching for a targeted reference position in a database for aligning the wafer image with the reference image; and in response to a determination that the targeted reference position does not exist in the database: identifying a current lock position and an area that encloses the current lock position on the wafer image; computing an alignment score of the current lock position; comparing the alignment score of the current lock position with stored alignment scores of positions previously selected in relation to aligning the wafer image with the reference image; and aligning the wafer image with the reference image based on the comparison.

In the method, aligning the wafer image with the reference image based on the comparison may further comprise: in response to a determination that the alignment score of the current lock position satisfies a threshold condition: storing location information and the alignment score of the current lock position at the database to facilitate a determination of a targeted reference position; and aligning the area enclosing the current lock position with the reference image using the current lock position.

In the method, the alignment score of the current lock position may satisfy the threshold condition when the alignment score of the current lock position is higher than the stored alignment scores of positions that are located within the area enclosing the current lock position, the positions that are located within the area enclosing the current lock position being the positions previously selected in relation to aligning the wafer image with the reference image.

In the method, aligning the image with the reference image based on the comparison may further comprise: in response to a determination that the alignment score of the current lock position does not satisfy a threshold condition: selecting a highest alignment score among the stored alignment scores; and aligning the area enclosing the current lock position with the reference image using a lock position corresponding to the highest alignment score.

In the method, the threshold condition may not be satisfied when the alignment score of the current lock position is lower than the stored alignment scores of positions that are located within the area enclosing the current lock position, the positions that are located within the area enclosing the current lock position being the positions previously selected in relation to aligning the wafer image with the reference image. The lock position corresponding to the highest alignment score may be a location that is in a field of view and that is different than the current lock position. The area enclosing the current lock position may be a field of view or a portion of a field of view.

In the method, the positions previously selected in relation to aligning the wafer image with the reference image may include positions that are located within the area enclosing the current lock position being a first portion of the positions previously selected or positions that are not located within the area enclosing the current lock position being a second portion of the positions previously selected. The positions previously selected in relation to aligning the wafer image with the reference image including the positions that are located within the area enclosing the current lock position being the first portion of the positions previously selected or the positions that are not located within the area enclosing the current lock position being the second portion of the positions previously selected may further include: the positions that are located within the area enclosing the current lock position being the first portion of the positions previously selected; and the positions that are not located within the area enclosing the current lock position being the second portion of the positions previously selected. The first portion may be one or more of the positions previously selected, and the second portion may be one or more of the positions previously selected. The first portion may be none of the positions previously selected, and the second portion may be all of the positions previously selected. The first portion may be all of the positions previously selected, and the second portion may be none of the positions previously selected.

In the method, a size of the area enclosing the current lock position and a size of the area surrounding the targeted reference position may be within millimeter to nanometer scale. The current lock position may be defined based on a comparison of numbers of features existing at different regions of the wafer. The current lock position may be defined based on a comparison of numbers of pattern edges existing at different regions of the wafer. The current lock position may be located substantially at a center of the area enclosing the current lock position of the wafer. The determination of the targeted reference position may further comprise: identifying the current lock position as the targeted reference position. The identifying of the targeted reference position may be based on a comparison between a total number of times a position has been selected as a lock position in prior alignments and a threshold number. The threshold number may be 20. The reference image may comprise a graphic data system (GDS). The reference image may be an image of a different wafer.

According to some embodiments of the present disclosure, there is provided an electron beam inspection apparatus, comprising: a controller having circuitry to cause the electron beam inspection apparatus to perform: searching for a targeted reference position in a database; and in response to a determination that the targeted reference position does not exist in the database: defining a current lock position and an area enclosing the current lock position on the wafer image; computing an alignment score of the current lock position; comparing the alignment score of the current lock position with stored alignment scores of positions previously selected in relation to aligning the wafer image with the reference image; and aligning the wafer image with a reference image based on the comparison.

In the apparatus, aligning the wafer image with a reference image based on the comparison may further include: in response to a determination that the alignment score of the current lock position satisfies a threshold condition: storing location information and the alignment score of the current lock position at the database to facilitate a determination of a targeted reference position; and aligning the area enclosing the current lock position with the reference image using the current lock position.

In the apparatus, aligning the wafer image with a reference image based on the comparison may further include: in response to a determination that the alignment score of the current lock position does not satisfy a threshold condition: selecting a highest alignment score among the stored alignment scores; and aligning the area enclosing the current lock position with the reference image using a lock position corresponding to the highest alignment score.

According to some embodiments of the present disclosure, there is provided a non-transitory computer readable medium storing a set of instructions that is executable by a controller of a device to cause the device to perform a method comprising: searching for a targeted reference position in a database; and in response to a determination that the targeted reference position does not exist in the database: defining a current lock position and an area enclosing the current lock position on the wafer image; computing an alignment score of the current lock position; comparing the alignment score of the current lock position with stored alignment scores of positions previously selected in relation to aligning the wafer image with a reference image; and aligning the wafer image with the reference image based on the comparison.

In the non-transitory computer readable medium, aligning the wafer image with a reference image based on the comparison may further include: in response to a determination that the alignment score of the current lock position satisfies a threshold condition: storing location information and the alignment score of the current lock position at the database to facilitate a determination of a targeted reference position; and aligning the area enclosing the current lock position with the reference image using the current lock position.

In the non-transitory computer readable medium, aligning the wafer image with a reference image based on the comparison may further include: in response to a determination that the alignment score of the current lock position does not satisfy a threshold condition: selecting a highest alignment score among the stored alignment scores; and aligning the area enclosing the current lock position with the reference image using a lock position corresponding to the highest alignment score.

BRIEF DESCRIPTION OF FIGURES

FIG. 1A is a schematic scanning electron microscope (SEM) image alignment diagram illustrating an accurate alignment, and FIG. 1B is a schematic SEM image alignment diagram illustrating an inaccurate alignment, consistent with some embodiments of the present disclosure.

DETAILED DESCRIPTION

Figure 2:
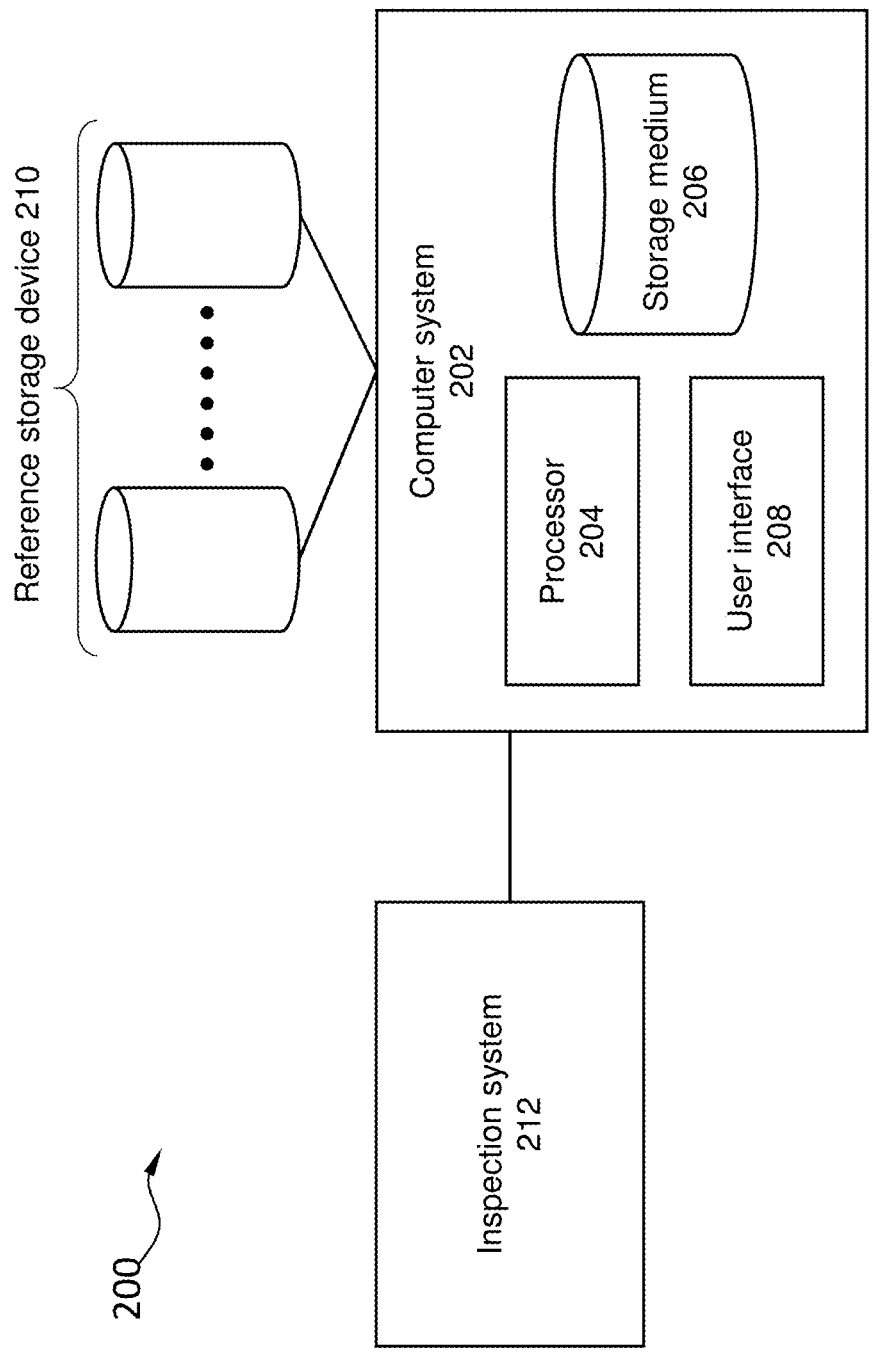
FIG. 2 is a block diagram illustrating an exemplary alignment system, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing electron beam inspection (EBI) system such as scanning electron microscope (SEM) for generation of a wafer image, the disclosure is not so limited. Other types of inspection system and image generation system be similarly applied.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $1/1000^{th}$ of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

In various steps of the semiconductor manufacturing process, pattern defects can appear on at least one of a wafer, a chip, or a mask, which can cause a manufactured semiconductor device to fail, thereby reducing the yield to a great degree. As semiconductor device sizes continually become smaller and smaller (along with any defects), identifying defects becomes more challenging and costly. Currently, engineers in semiconductor manufacturing lines usually spend usually hours (and even sometimes days) to identify locations of small detects to minimize their impact on the final product.

Conventional optical inspection techniques are ineffective in inspecting small defects (e.g., nanometer scale defects). Advanced electron-beam inspection (EBI) tools, such as a scanning electron microscope (SEM) with high resolution and large depth-of-focus, have been developed to meet the need in the semiconductor industry. An important step during the defect inspection in EBI tools is to align a wafer image to a reference image (e.g., graphic data system (GDS) file). For example, a SEM image of a wafer may be overlaid with the reference image, after which the position of the wafer image relative to the reference image may be adjusted until features in the wafer image substantially match features in the reference image. In this way, the to-be-inspected wafer image is mapped to the reference image coordinates and the location of a defect on the wafer image can be identified in the reference image coordinates.

While EBI tools play a critical role in small defect detection for semiconductor wafers, they are sensitive to the alignment accuracy of the wafer image with the reference image. Because the pixel size of a SEM image is small, there is not much room for an alignment error. Thus, the alignment accuracy plays a critical role for EBI tools when inspecting wafers and identifying defects.

Alignment, however, is a challenging task, especially when there is substantial amount of noise or distortion in the images, or a great portion of the image has periodic patterns (e.g., array patterns where each element looks like all other elements, making it difficult to match a particular element in the wafer image with its corresponding element in the reference image). Another inherent challenge of alignment is the difficulty to have a unified metric/score threshold to differentiate an accurate alignment from an inaccurate alignment.

The disclosed embodiments provide an adaptive alignment process that improves alignment accuracy during the process of defect inspection. The alignment process produces an alignment score resulting from an aligning an image with a reference image based on a selected location on either the image or the reference image. The alignment score and the selected location can be stored for later referencing.

When the next image is ready for inspection, the alignment process can generate a second alignment score, which can be compared to previously stored alignment scores. If the second alignment score is higher than the stored scores, then the second alignment score and its corresponding selected location are stored for later referencing. The process can continue until all images are inspected. By consistently updating the storage pool with alignment scores and their corresponding selected locations and evaluating whether a better candidate exists, the accuracy of the alignment is improved.

Moreover, the adaptive alignment process can be performed without manual intervention and can accelerate the inspection process, leading to higher throughput.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

References are now made to FIG. 1A, a schematic SEM image alignment diagram illustrating an accurate alignment, and FIG. 1B, a schematic SEM image alignment diagram illustrating an inaccurate alignment, consistent with some embodiments of the present disclosure. As shown in FIG. 1A, a wafer image 110 has a hole pattern that is generated in a semiconductor manufacturing process. The hole pattern in wafer image 110 has a one missing hole defect 102, which needs to be identified. A reference image 120 (which corresponds to wafer image 110) has a square pattern, including a square 104 at a location corresponding to hole defect 102 on the wafer image. In an alignment process, wafer image 110 is overlaid with reference image 120 and then the position of wafer image 110 relative to reference image 120 is adjusted such that the hole pattern of wafer image 110 substantially matches the square pattern in reference image 120, indicating an accurate alignment, as shown an overlaid image 130. In this way, wafer image 110 is mapped to reference image coordinates (e.g., the x-y coordinates shown in the figure) and the location of hole defect 102 on wafer image 110 can be accurately identified by the position of square 104 (overlapping hole defect 102 on overlaid image 130) in the x-y coordinates.

FIG. 1B shows an example of an inaccurate alignment. As shown in FIG. 1B, a wafer image 140 has a hole pattern that is generated in a semiconductor manufacturing process. The hole pattern in wafer image 140 has a hole 106. A reference image 150 has a square pattern, including a square 108 at a position corresponding to hole 106. During this exemplary alignment process, wafer image 140 is overlaid with reference image 150, but the position of wafer image 140 relative to reference image 150 has not been adjusted such that the hole pattern of wafer image 140 substantially matches the square pattern in reference image 150. More specifically, the square pattern is shifted to the left by an amount of a periodic distance T, as evidenced by the separation by distance T between square 108 and hole 106 on an overlaid image 160 (they should overlap if the alignment is accurate). Thus, location of defects on wafer image 140 cannot be accurately identified in reference image coordinate (e.g., the x-y coordinates as shown in the figure).

To assist with determining whether an alignment is accurate, an alignment algorithm may be used to generate an alignment score. An alignment score may be used to indicate accuracy of an alignment, with a higher alignment score indicating a more accurate alignment. An alignment score may be determined based on a difference in pixel intensity values between a wafer image and a reference image, for example, a sum of squared differences in intensity of a wafer image and a reference image, respectively. Alternatively, an alignment score may be determined based on correlation coefficients between a wafer image and a reference image.

Some alignment score algorithms may not be optimal. For example, the alignments shown in FIG. 1A and FIG. 1B, even though different, may result in very similar alignment scores. Alignment errors are difficult to control due to a lack of a unified metric to evaluate alignment results, and misalignment causes a high nuisance rate in defect detection results. A nuisance can be, for example, a false positive defect, and a nuisance rate can be expressed as a ratio between a number of false positive defects and a total number of flagged defects. In FIG. 1B, due to misalignment, hole 106 was not aligned with square 108. As a result, hole 106 could be flagged as a defect when, in fact, it is not a defect, but instead results from the misalignment of the wafer image with the reference image. This is an example of an inaccurate alignment producing a false positive (i.e., a nuisance). As one can imagine, inaccurate alignment may produce a large number of false positives in the detection results, resulting in a higher nuisance rate for a particular image.

In another example that includes a given image A and two reference images R1 and R2, a defect may be identified by calculating differences D1 and D2 in intensities between image A and the two reference images R1 and R2, i.e., D1=|A-R1| and D2=|A-R2|. If image A is defective, then the defects will show up on difference computations D1 and D2. In the case that image A is non-defective and the alignment of image A and reference images R1 and R2 are optimal, pixel values in difference computations D1 and D2 will be zero or close to zero. However, in the case of inaccurate alignment, there are a lot of non-zero pixels in difference computations D1 and D2, causing features on image A to be incorrectly marked as being defects (i.e. false positives or nuisances). False positive defects such as these increase the difficulty of identifying real defects of interest by operators or automatic defect classifiers, due to having to spend time or computational resources to analyze these false positives. Accordingly, conventional alignment systems may have difficulty distinguishing an inaccurate alignment from an accurate alignment. Thus, there is a demand for an accurate and adaptive alignment method for defect detection in wafers.

Reference is now made to FIG. 2, a block diagram illustrating an exemplary alignment system, consistent with some embodiments of the present disclosure. As shown in FIG. 2, an alignment system 200 comprises a computer system 202, an inspection system 212 and a reference storage device 210. Computer system 202 further comprises a processor 204, a storage medium 206 and a user interface 208. Processor 204 can comprise multiple processors, and storage medium 206 and reference storage device 210 can be a same single storage medium. Computer system 202 is in communication with inspection system 212 and reference storage device 210 via wired or wireless communications.

Computer system 202 may include, but is not limited to, a personal computer, a workstation, a network computer or any device having one or more processors. Storage medium 206 stores alignment instructions and processor 204 is configured (via its circuitry) to execute the alignment instructions to control the alignment process. Processor 204 is configured to build a plurality of alignment knowledge files based on a plurality of alignments of patch images. A patch image is a small image (e.g., 34×34 pixels) of a portion of the wafer. The plurality of patch images can be generated by a wafer inspection system 212. Processor 204 is configured to process the patch images transmitted from inspection system 212 and performs alignment of the patch image of the wafer with a reference image transmitted from reference storage device 210.

User interface 208 includes a display configured to display an alignment image of a wafer, an input device configured to transmit user command to computer system 202, etc. The display may be any type of a computer output surface and projecting mechanism that shows text and graphic images, including but not limited to, cathode ray tube (CRT), liquid crystal display (LCD), light-emitting diode (LED), gas plasma, a touch screen, or other image projection technologies, for displaying information to a computer user. The input device may be any type of a computer hardware equipment used to provide data and control signals from an operator to computer system 202. The input device may include, but is not limited to, a keyboard, a mouse, a scanner, a digital camera, a joystick, a trackball, cursor direction keys, a touchscreen monitor, or audio/video commanders, etc., for communicating direction information and command selections to processor or for controlling cursor movement on display.

Reference storage device 210 stores a reference file database that is accessed by computer system 202 during alignment process. In some embodiments, reference storage device 210 may be a part of computer system 202. The reference image file for inspection of the wafer can be manually provided to computer system 202 by a human operator. Alternatively, reference storage device 210 may be implemented with a processor and the reference image file can be automatically provided to computer system 202 by reference storage device 110. Reference storage device 210 may be a remote server computer configured to store and provide any reference images, may be cloud storage, etc.

Inspection system 212 can be any inspection system that can generate an image of a wafer. The wafer can be a semiconductor wafer substrate, a semiconductor wafer substrate having one or more epitaxial layers or process films, etc. The embodiments of the present disclosure do not limit the specific type for wafer inspection system 212 as long as it can generate a wafer image having a resolution high enough to observe key features on the wafer (e.g., less than 20 nm), consistent with contemporary semiconductor foundry technologies. In some embodiments of the present disclosure, inspection system 212 is an electron beam inspection (EBI) system 304 described with respect to FIG. 3.

Once a wafer image is acquired by inspection system 212, the wafer image may be transmitted to computer system 202 where the system can align the wafer image with a reference image (e.g., GDS). Computer system 202 and reference storage device 210 may be part of or remote from inspection system 212.

Figure 3:
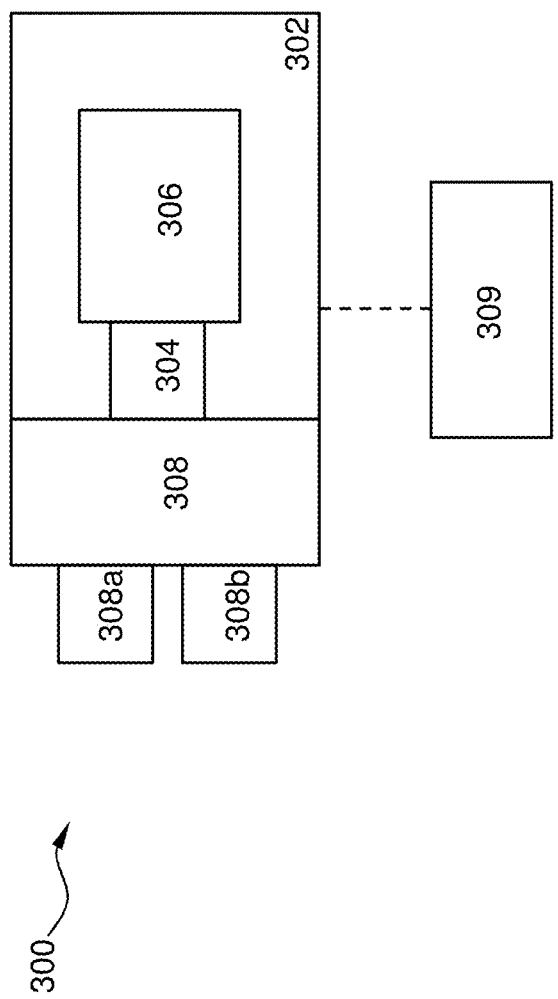
FIG. 3 is a schematic diagram illustrating an exemplary electron beam inspection (EBI) system, consistent with some embodiments of the present disclosure.

Reference is now made to FIG. 3, a schematic diagram illustrating an exemplary electron beam inspection system, consistent with some embodiments of the present disclosure. As shown in FIG. 3, electron beam inspection system 300 includes a main chamber 302, a load/lock chamber 304, an electron beam tool 306, and an equipment front end module 308. Electron beam tool 306 is located within main chamber 302. Equipment front end module 308 includes a first loading port 308a and a second loading port 308b. Equipment front end module 308 may include additional loading port(s). First loading port 308a and second loading port 308b receive wafer cassettes that contain wafers (e.g., semiconductor wafers or wafers made of other material(s)) or samples to be inspected (wafers and samples are collectively referred to as "wafers" hereafter). One or more robot arms (not shown) in equipment front end module 308 transport the wafers to load/lock chamber 304. Load/lock chamber 304 is connected to a load/lock vacuum pump system (not shown) which removes gas molecules in load/lock chamber 304 to reach a first pressure below the atmospheric pressure. After reaching the first pressure, one or more robot arms (not shown) transport the wafer from load/lock chamber 304 to main chamber 302. Main chamber 302 is connected to a main chamber vacuum pump system (not shown) which removes gas molecules in main chamber 302 to reach a second pressure below the first pressure. After reaching the second pressure, the wafer is subject to inspection by electron beam tool 306.

Figure 4:
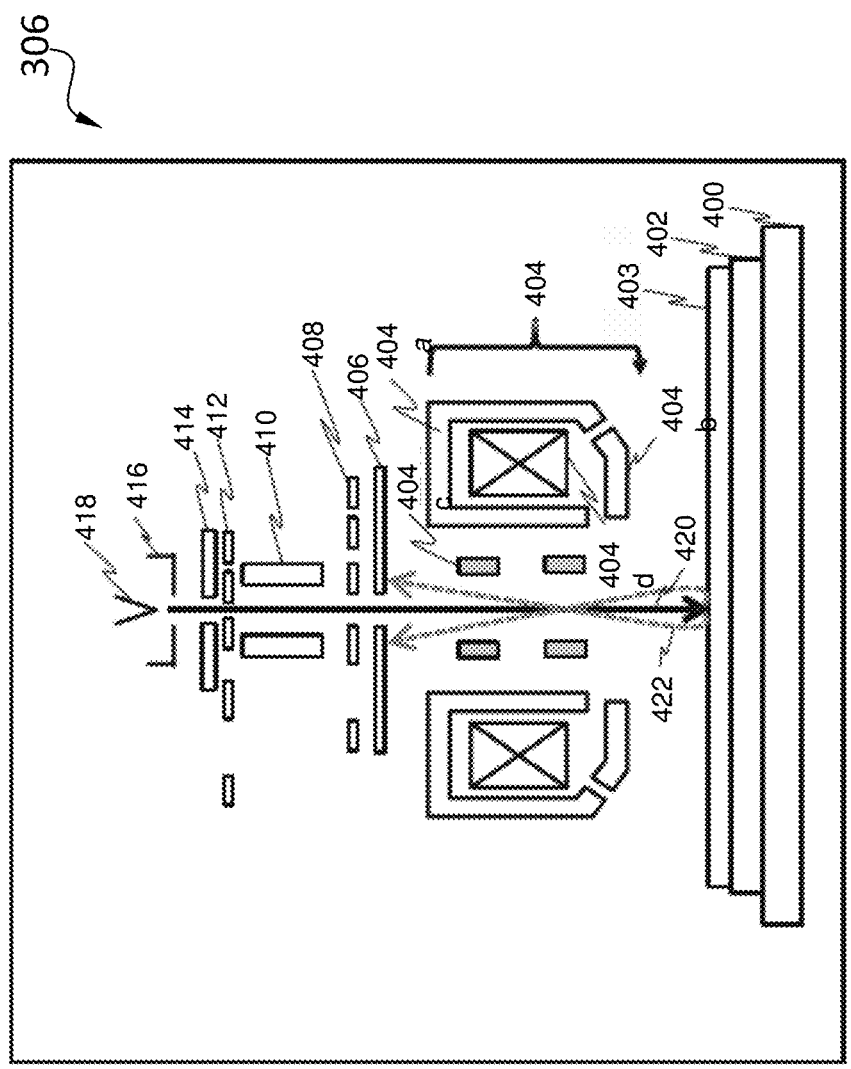
FIG. 4 is a schematic diagram illustrating an exemplary electron beam tool that can be a part of the exemplary electron beam inspection (EBI) system of FIG. 3, consistent with some embodiments of the present disclosure.

References are now made to FIG. 4, a schematic diagram illustrating an exemplary electron beam tool that can be a part of the exemplary electron beam inspection of FIG. 3, consistent with some embodiments of the present disclosure. FIG. 4 illustrates exemplary components of electron beam tool 306, consistent with embodiments of the present disclosure. As shown in FIG. 4, electron beam tool 306 includes a motorized stage 400, and a wafer holder 402 supported by motorized stage 400 to hold a wafer 403 to be inspected. Electron beam tool 306 further includes an objective lens assembly 404, electron detector 406 (which includes electron sensor surfaces), an objective aperture 408, a condenser lens 410, a beam limit aperture 412, a gun aperture 414, an anode 416, and a cathode 418. Objective lens assembly 404, in some embodiments, can include a modified swing objective retarding immersion lens (SORIL), which includes a pole piece 404a, a control electrode 404b, a deflector 404c, and an exciting coil 404d. Electron beam tool 306 may additionally include an energy dispersive X-ray spectrometer (EDS) detector (not shown) to characterize the materials on the wafer.

A primary electron beam 420 is emitted from cathode 418 by applying a voltage between anode 416 and cathode 418. Primary electron beam 420 passes through gun aperture 414 and beam limit aperture 412, both of which can determine the size of electron beam entering condenser lens 410, which resides below beam limit aperture 412. Condenser lens 410 focuses primary electron beam 420 before the beam enters objective aperture 408 to set the size of the electron beam before entering objective lens assembly 404. Deflector 404c deflects primary electron beam 420 to facilitate beam scanning on the wafer. For example, in a scanning process, deflector 404c can be controlled to deflect primary electron beam 420 sequentially onto different locations of top surface of wafer 403 at different time points, to provide data for image reconstruction for different parts of wafer 403. Moreover, deflector 404c can also be controlled to deflect primary electron beam 420 onto different sides of wafer 403 at a particular location, at different time points, to provide data for stereo image reconstruction of the wafer structure at that location. Further, in some embodiments, anode 416 and cathode 418 may be configured to generate multiple primary electron beams 420, and electron beam tool 306 may include a plurality of deflectors 404c to project the multiple primary electron beams 420 to different parts/sides of the wafer at the same time, to provide data for image reconstruction for different parts of wafer 203.

Exciting coil 404d and pole piece 404a generate a magnetic field that begins at one end of pole piece 404a and terminates at the other end of pole piece 404a. A part of wafer 403 being scanned by primary electron beam 420 can be immersed in the magnetic field and can be electrically charged, which, in turn, creates an electric field. The electric field reduces the energy of impinging primary electron beam 420 near the surface of the wafer before it collides with the wafer. Control electrode 404b, being electrically isolated from pole piece 404a, controls an electric field on the wafer to prevent micro-arching of the wafer and to ensure proper beam focus.

A secondary electron beam 422 can be emitted from the part of wafer 403 upon receiving primary electron beam 420. Secondary electron beam 422 can form a beam spot on a surface of a sensor of electron detector 406. Electron detector 406 can generate a signal (e.g., a voltage, a current, etc.) that represents an intensity of the beam spot and provide the signal to a processing system (not shown). The intensity of secondary electron beam 422, and the resultant beam spot, can vary according to the external or internal structure of wafer 403. Moreover, as discussed above, primary electron beam 420 can be projected onto different locations of the top surface of the wafer to generate secondary electron beams 422 (and the resultant beam spot) of different intensities. Therefore, by mapping the intensities of the beam spots with the locations of wafer 403, the processing system can reconstruct an image that reflects the internal or external structures of wafer 403. Once a wafer image is acquired by electron beam tool 306, the wafer image may be transmitted to computer system 402 (as shown in FIG. 2) where the computer system can align the wafer image with a reference image (e.g., GDS).

Figure 5:
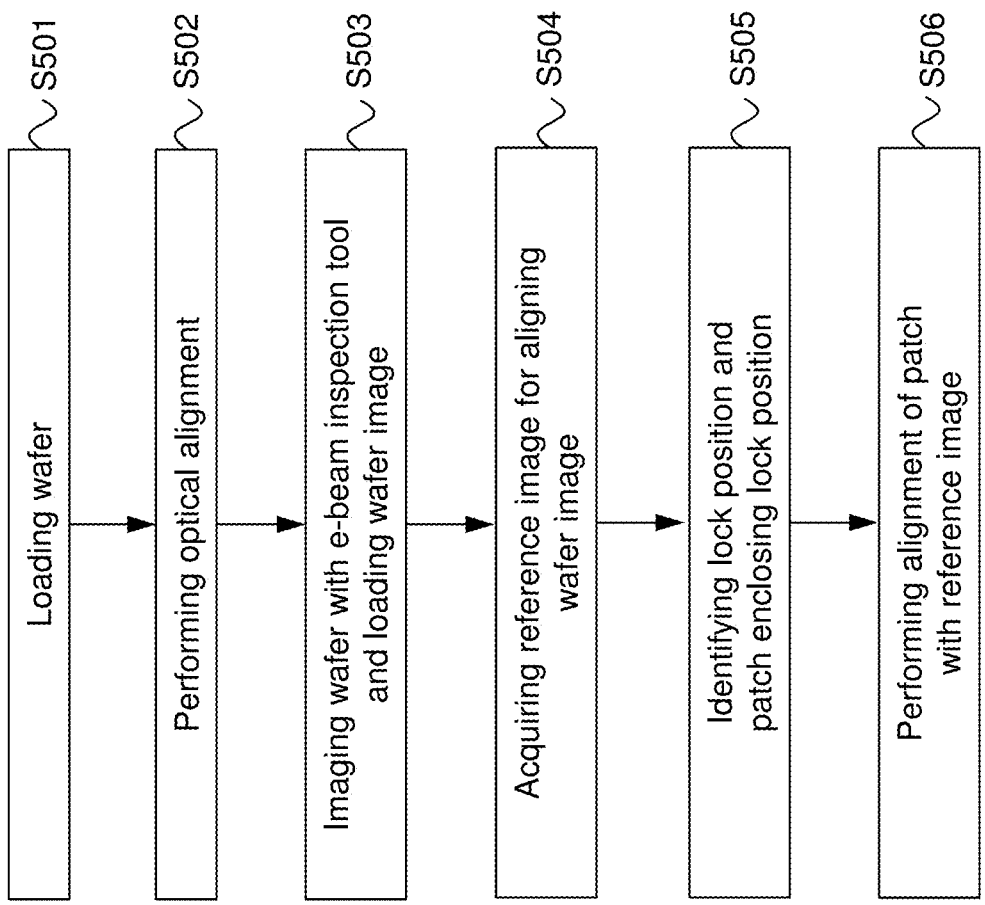
FIG. 5 is a flowchart indicating an exemplary method of aligning an image of a wafer with a reference image, consistent with some embodiments of the present disclosure.

Reference is now made to FIG. 5, a flowchart indicating an exemplary method of alignment, consistent with some embodiments of the present disclosure. As shown in FIG. 5, in step S501, a wafer to be inspected is loaded onto a wafer inspection system. The wafer inspection system may be an electron beam inspection (EBI) system, such as the EBI system as described with respect to FIG. 3.

In step S502, an optical alignment of the wafer (global alignment) is performed. Since optical alignment is ineffective for detecting small defects (e.g., nanometer scale defects) due to low resolution (typically tens to hundreds of nanometers), in step S503, EBI tools such as a scanning electron microscope (SEM) having higher resolution and larger depth-of-focus is used. More specifically, in step S503, the wafer is imaged using the SEM. The wafer image can be loaded into a computer system (e.g., computer system 202 of FIG. 2).

In step S504, a reference image can be acquired by the computer system for aligning with the wafer image. For example, the computer system can acquire the reference image via storage on the computer system or via a remote storage.

In step S505, a lock position and patch enclosing the lock position are identified to assist with alignment of the wafer image and the reference image. The lock position refers to an alignment structure on either the wafer image or the reference image, while the patch refers to an area surrounding the alignment structure. The computer system uses the lock position and patch to lock the positioning of the wafer image with respect to the reference image. For example, the reference image could be overlaid with the wafer image, and the relative position of the two images is adjusted until a structure of the reference image and a structure of the wafer image lock into place.

To perform the locking of the image, for example, a wafer image's alignment structure (e.g., a specific set of holes on a hole pattern) can be analyzed to determine how the structure interlocks with the reference image's alignment structure (e.g., a specific set of squares on a square pattern) to provide an accurate alignment. The selection of the alignment structure can strongly affect whether an accurate alignment occurs. That is, the more unique the alignment structure is, the more likely that an accurate alignment can occur.

Figure 6:
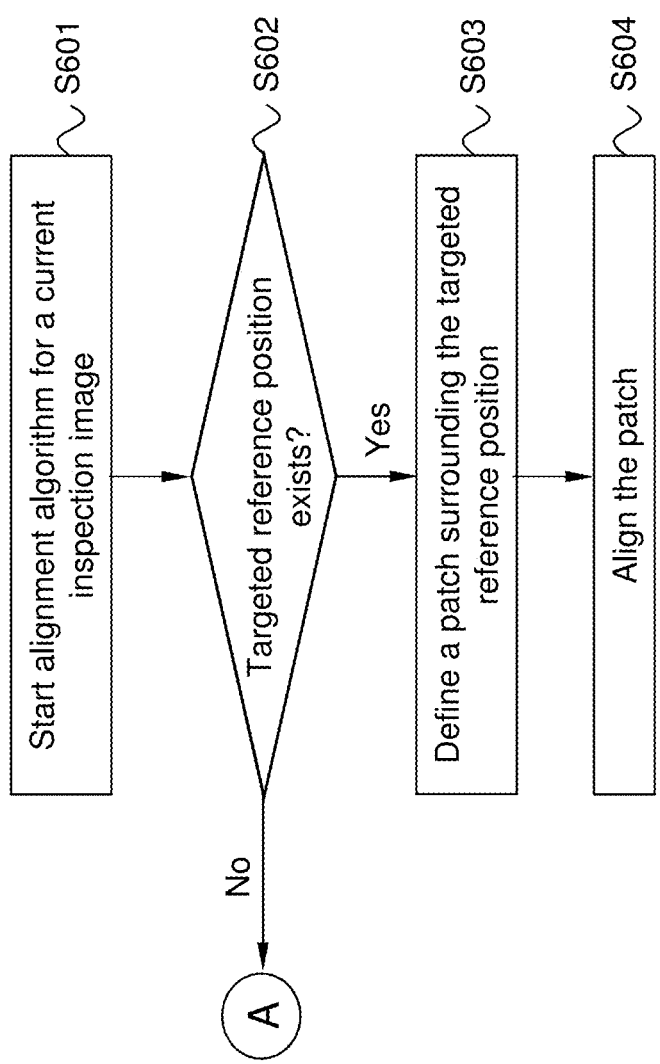
FIG. 6 is a flowchart indicating a detailed exemplary method of aligning a wafer image with a reference image, consistent with some embodiments of the present disclosure.

After the lock position and patch are selected, in step S506, the alignment of the wafer image with the reference image is performed, which is described in detail with respect to FIG. 6.

Reference is now made to FIG. 6, a flowchart indicating a detailed exemplary method of aligning a wafer image with a reference image, consistent with some embodiments of the present disclosure. In FIG. 6, step S601 describes starting an alignment process for a current image of a wafer with a reference image. The current image may be an image captured by an electron-beam tool, such as a SEM. Step S602 describes searching for a targeted reference position on the wafer image for the alignment. A targeted reference position may be a position that has been selected multiple times during prior inspection process or has been confirmed from prior inspection results. The targeted reference position may be based on one or more unique features (e.g., non-periodic patterns in a logic area) such that an alignment position can be locked without ambiguity. Without such a unique feature, it is difficult to accurately match a wafer image having only periodic patterns with a reference image because each element in the patterns looks similar to all other elements. The targeted reference position may be identified based on a total number of times a position has been selected as a lock position in prior alignments, for example, by comparing the total number with a predetermined threshold number. The threshold number may be a number defined by a user. In some embodiments, the threshold number is be 20.

Alternatively, a targeted reference position may be identified based on inspection results of other wafers produced in the same process as the wafer because wafers produced under the same conditions may have similar patterns or features. In response to determining that the targeted reference position exists, in step S603, a patch surrounding the targeted reference position is defined. In this way, an area to be aligned is defined on the wafer image and in step S604, an alignment of the patch with a reference image is performed using the targeted reference position. By selecting a targeted reference position, rather than a random position, as a lock position, accuracy of the alignment is improved. Also, by starting the alignment process using a targeted reference position, which has been proven as a reliable reference position in prior alignment processes, without searching and comparing for lock positions, the inspection process is accelerated, leading to higher throughput. On the other hand, in response to determining that the targeted reference position does not exist at S602, the method performs the operation A as shown in FIG. 7.

Figure 7:
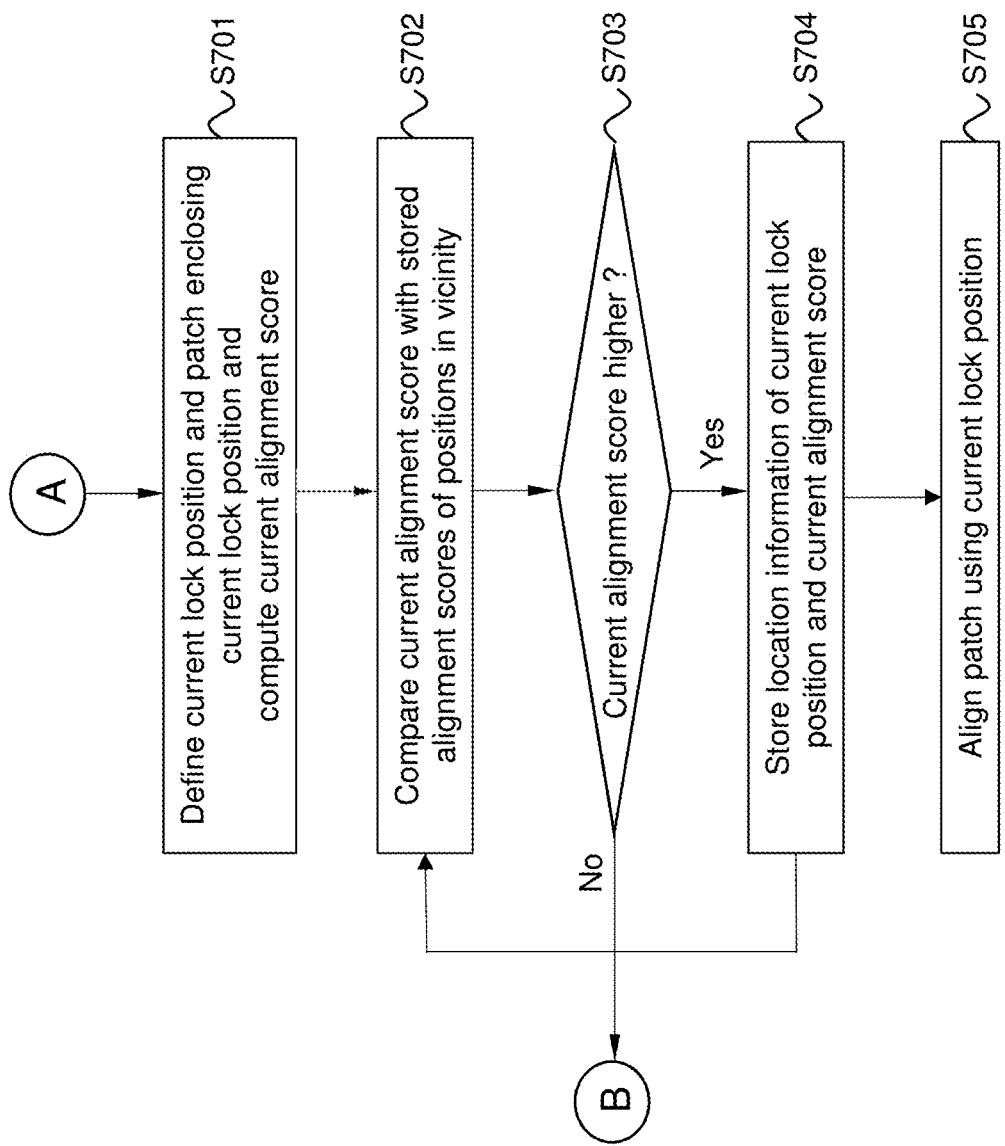
FIG. 7 is a flowchart indicating a detailed exemplary method of aligning a wafer image with a reference image, consistent with some embodiments of the present disclosure.

Reference is now made to FIG. 7, a flowchart indicating a detailed exemplary method of aligning an image of a wafer with a reference image, consistent with some embodiments of the present disclosure. As described above, the method of FIG. 7 depicts a scenario in which a targeted reference position does not exist. A targeted reference position does not exist on the wafer image due to, for example, no single lock position being selected multiple times in previous inspections, or prior inspection results not being applied to the current image due to the change of inspection condition, etc. In such cases, as shown in FIG. 7, in step S701, a current lock position and a patch enclosing the current lock position on the image of the wafer is defined and an alignment score of the current lock position is computed. The current lock position may be defined based on a comparison of numbers of random features existing at different regions of the wafer. For example, if one region of the wafer image has more random features than any other regions of the wafer image, the current lock position may be defined as a point (e.g., a center point) of that one region. Random features may include features that are of a unique shape or size that may be easily identified. Unique shapes/sizes make the likelihood of misalignment lower, as there may be fewer similar patterns that can be mistaken for the unique pattern. Alternatively, the current lock position may be defined based on a comparison of numbers of pattern edges existing at different regions of the wafer. For example, if one region of the wafer image has more pattern edges than any other regions of the image, the lock position may be defined as a point (e.g., a center point) of that one region. According to some embodiments, the patch enclosing the current lock position is a current field of view (FOV) such that alignment of the current FOV is performed based on one lock position, i.e., the current lock position. According to some embodiments, the patch enclosing the current lock position is a portion of a current FOV such that alignment of the current FOV is performed using a plurality of lock positions, including the current lock position.

The alignment score of the current lock position may be determined based on a sum of squared differences in intensity:

$$SSD = \Sigma_i (p_i - q_i)^2 \quad \text{(Equation 1)}$$

where $p_i$ and $q_i$ denote pixel intensity values of a wafer image and a reference image, respectively.

Alternatively, the alignment score of the current lock position may be determined based on correlation coefficients between two images:

$$r = \frac{\sum_i (p_i - \bar{p})(q_i - \bar{q})}{\sqrt{\sum_i (p_i - \bar{p})^2} \sqrt{\sum_i (q_i - \bar{q})^2}} \quad \text{(Equation 2)}$$

where $p_i$ and $q_i$ denote pixel intensity values of a wafer image and a reference image, respectively, and $\bar{p}$ and $\bar{q}$ denote mean intensity values of the wafer image and the reference image, respectively.

In FIG. 7, in step S702, the computer system compares the alignment score of the current lock position with stored alignment scores of positions in vicinity of the current lock position. The positions in vicinity of the current lock position may be positions located within the patch enclosing the current lock position and previously selected in relation to aligning the wafer image with the reference image. The alignment scores of the positions in vicinity of the current lock position may be computed with the formulas used in calculating the alignment scores of the current lock position.

In FIG. 7, in step S703, if it is determined that the alignment score of the current lock position satisfies a threshold condition (e.g., as shown, that the alignment score of the current lock position is higher than the stored alignment scores of positions in vicinity of the current lock position), in step S704, location information and the alignment score of the current lock position are stored. For example, this information may be stored in storage medium 206, as shown in FIG. 2. The data within the storage medium may be consistently updated through the inspection process with alignment scores and corresponding location information. The updated storage information may, in turn, be used at step S702 for selection of a better candidate lock position.

By consistently updating the storage medium with location information and alignment scores of the current lock positions and consistently checking whether a better candidate lock position exists, the accuracy of selection of a lock position is adaptively improved, resulting in increased alignment accuracy.

After or during the storing of step S704, in step S705, alignment of the patch enclosing the current lock position with the reference image is performed using the current lock position.

Figure 8:
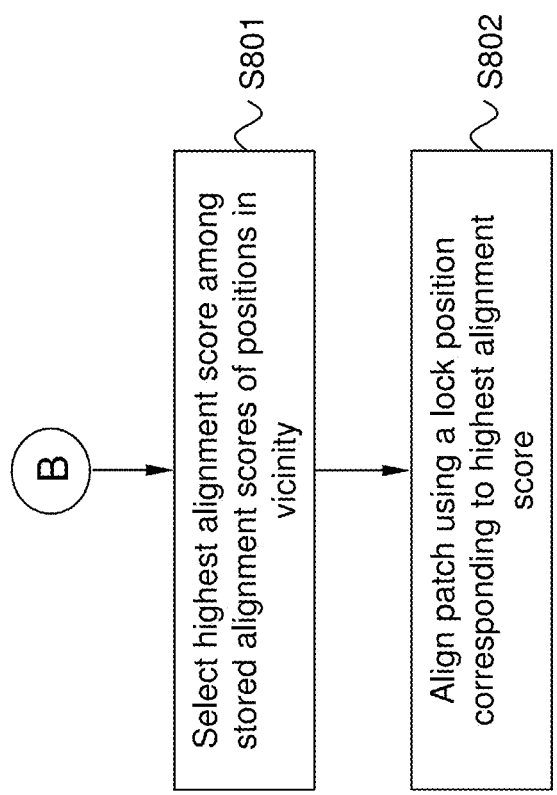
FIG. 8 is a flowchart indicating a detailed exemplary method of aligning a wafer image with a reference image, consistent with some embodiments of the present disclosure.

On the other hand, in response to determining that the alignment score of the current lock position does not satisfy the threshold condition (e.g., as shown, the alignment score of the current lock position being lower than the stored alignment scores of the positions in vicinity of the current lock position) at step S703, the method performs operation B as shown in FIG. 8.

Reference is now made to FIG. 8, a flowchart indicating an exemplary method of a local alignment, consistent with some embodiments of the present disclosure. As described above, the method in FIG. 8 depicts a scenario in which the alignment score of the current lock position does not satisfy a satisfy a threshold condition (e.g., as shown, the alignment score of the current lock position is lower than the stored alignment scores of the positions in vicinity of the current lock position). In such a case, as shown in FIG. 8, in step S801, the highest alignment score among the stored alignment scores is selected. In step S802, the patch enclosing the current lock position is aligned with the reference image using a lock position corresponding to the highest alignment score. The lock position corresponding to the highest alignment score may be a location that is in a current field of view and that is different than the current lock position. In this way, the best alignment point is selected for each wafer image. The alignment method disclosed in the present disclosure enables an adaptive scheme to automatically improve alignment accuracy during the course of defect inspection without manual intervening, hence achieving higher throughput.

Figure 9:
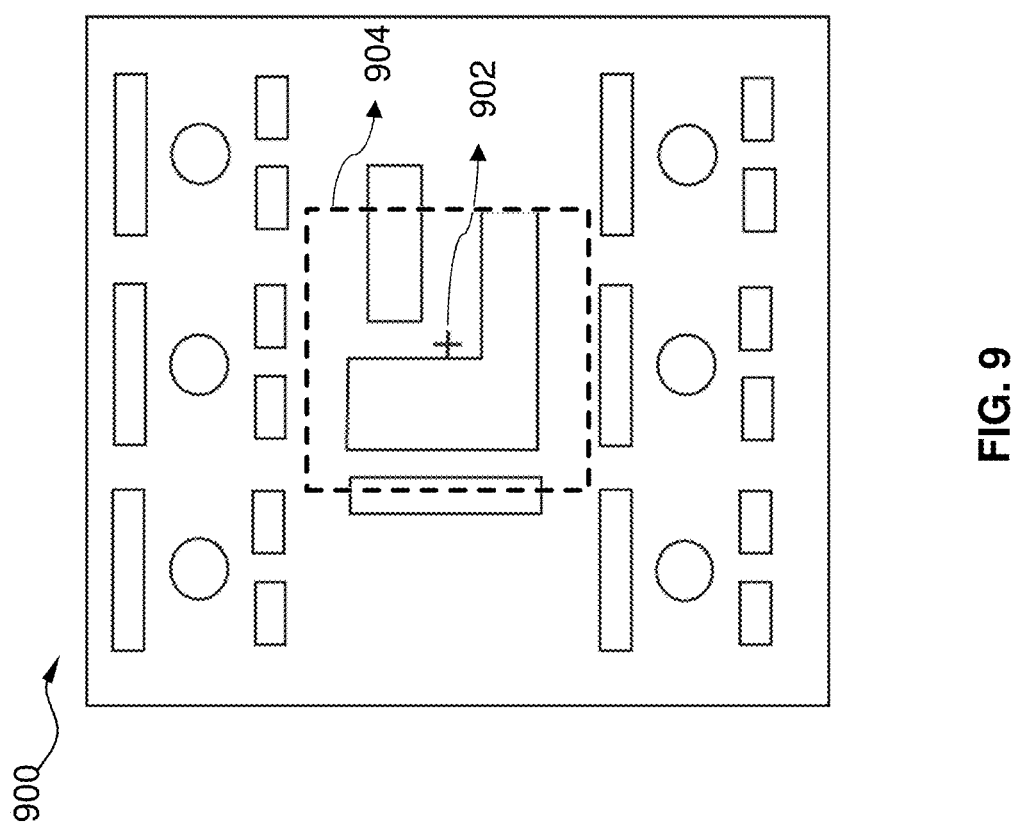
FIG. 9 is a schematic diagram illustrating a SEM image for inspection and a lock position defined on the SEM image, consistent with some embodiments of the present disclosure.

Reference is now made to FIG. 9, a schematic diagram illustrating a wafer image obtained by a scanning electron microscope (SEM) for inspection and a lock position identified on the SEM image, consistent with some embodiments of the present disclosure. As shown in FIG. 9, a SEM image 900 of a wafer includes blue polygons indicating a plurality of patterns on the wafer. A red cross indicating a lock position 902 on image 900, and a red square enclosing the red cross indicating a patch 904 enclosing lock position 902 on image 900.

In some embodiments of the present disclosure, in FIG. 9, lock position 902 may be a targeted reference position, which may be a previously determined location surrounded by a patch of area containing features that may be used to align an image of a wafer, such as an image obtained by a SEM, and a reference image, such as an image defined in a GDS data set, an image of a second wafer, etc. In the example of FIG. 9, patch 904 is a previously determined patch of area surrounding lock position 902, the targeted reference position of this example. Features of the wafer can be analyzed to find a set of features similar to the features of patch 904. The more unique the set of features of the patch area, the more likely that a similar set of features discovered on an image of a wafer will be the "correct" matching set of features rather than a set of features that, while similar, are not the "correct" matching set of features, resulting in a misalignment. When a set of features sufficiently similar to the features of patch 904 are identified on the image of the wafer, the image of the wafer and the reference image may be aligned based on lock position 902. The targeted reference position may be identified based on a total number of times a position has been selected as a lock position in prior alignments. Alternatively, the targeted reference position may be identified based on inspection results of another wafer produced in the same process as the wafer.

In some embodiments of the present disclosure, in FIG. 9, a lock position 902 may be a current lock position defined on image 900 of the wafer for aligning the image with a reference image, in response to determining that a targeted reference position does not exist. Patch 904 is an area enclosing the defined current lock position. In such cases, the alignment of patch 904 with the reference image is performed using the current lock position. In particular, an alignment score of current lock position 902 is calculated and compared with stored alignment scores of positions in vicinity of current lock position 902. The positions in vicinity of the current lock position may be positions previously selected in relation to aligning the image with the reference image. If it is determined that the alignment score of current lock position 902 is higher than the stored alignment scores of positions in vicinity of current lock position 902, a location information and the alignment score of current lock position 902 are stored, and the alignment of patch 904 with the reference image is performed using current lock position 902. The location information and alignment score of the current lock position are stored on the fly during the inspection, and thereby the storage pool is consistently updated. The consistently updated storage pool is, in turn, used for selection of a better candidate lock position. By consistently updating the storage pool with the location information and alignment score of the current lock positions on the fly during the inspection, and consistently checking whether a better candidate lock position exists, the accuracy of selection of a lock position is adaptively improved and thereby accuracy of the alignment is improved.

If the alignment score of current lock position 902 is lower than the stored alignment scores of the positions in vicinity of current lock position 902, a highest alignment score among the stored alignment scores is selected and the alignment of patch 904 with the reference image is performed using a lock position corresponding to the highest alignment score. In this way, the best alignment point(s) on the wafer image is identified and an area enclosing the best alignment point is a selected for the alignment.

In some embodiments of the present disclosure, a size of the area enclosing the current lock position and a size of the area enclosing the targeted reference position is within millimeter to nanometer scale. The current lock position may be defined based on comparison of numbers of random features existing at different regions of the wafer, or based on comparison of numbers of pattern edges existing at different regions of the wafer. The current lock position may be located at a center of the area enclosing the current lock position of the wafer. Similarly, the targeted reference position may be located at a center of the area enclosing the targeted reference position. The alignment score of the current lock position and the stored alignment scores may be computed using Equation 1 or Equation 2.

Figure 10:
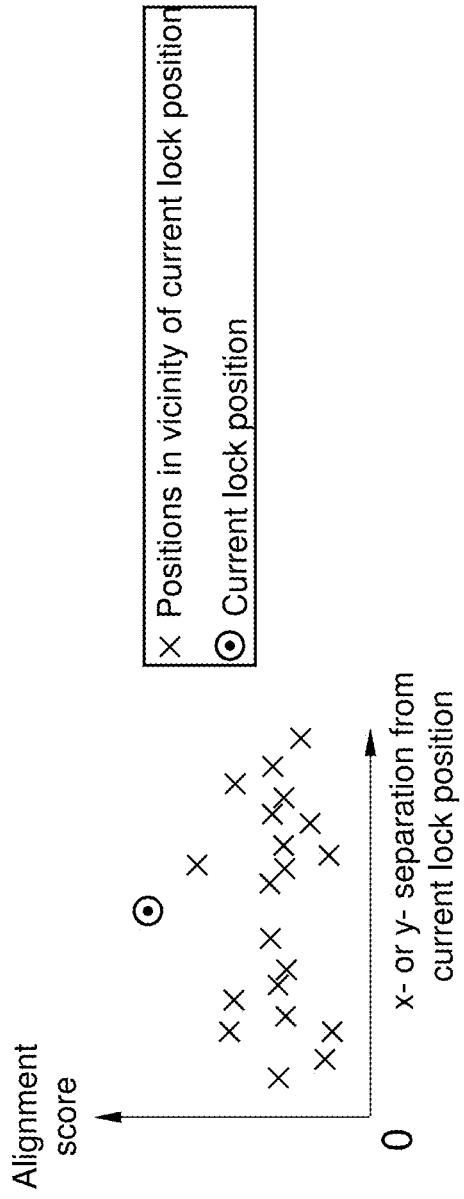
FIG. 10 and FIG. 11 are schematic diagrams illustrating a comparison of an alignment score of a current lock position and alignment scores of positions in vicinities of the current lock position, consistent with some embodiments of the present disclosure.
Figure 11:
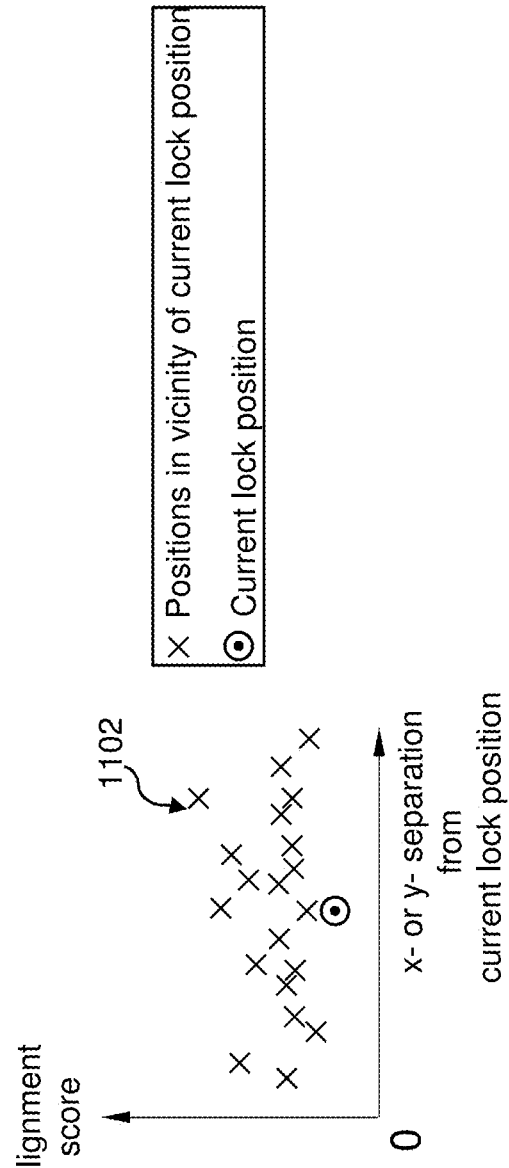

References are now made to FIG. 10 and FIG. 11, schematic diagrams illustrating comparison of an alignment score of a current lock position and alignment scores of positions in vicinity of the current lock position, consistent with some embodiments of the present disclosure. In FIG. 10 and FIG. 11, the vertical axes indicate alignment scores of a current lock position and positions in vicinity of the current lock positions, and the horizontal axes indicate a separation of positions in vicinity of the current lock position from the current lock position. In FIG. 10, the alignment scores of the positions in vicinity of the current lock position (20 different positions in this case) are lower than the alignment score of the current lock position. As such, alignment of an area enclosing the current lock position with a reference image is performed using the current lock position.

On the other hand, in FIG. 11, the alignment scores of the positions in vicinity of the current lock position (20 different positions in this case) are higher than the alignment score of the current lock position. In such a case, a position having the highest alignment score (indicated as 1102) among the 20 different positions is selected, and alignment is performed using the position having the highest alignment score. In this way, a position having the highest alignment score within an area is selected for an alignment point and thereby accuracy of the alignment is improved.

Now referring back to FIG. 2, computer system 202 may be a controller of inspection system 212 (e.g., e-beam inspection system) and the controller may include circuitry for: searching for a targeted reference position on a wafer image; and in response to a determination that the targeted reference position does not exist: defining a current lock position and an area enclosing the current lock position on the image of the wafer; computing an alignment score of the current lock position; comparing the alignment score of the current lock position with stored alignment scores of positions previously selected in relation to aligning the image with the reference image; and aligning the wafer image with a reference image based on the comparison.

In the inspection system, the aligning of the image with a reference image based on the comparison may further include: in response to a determination that the alignment score of the current lock position is higher than the stored alignment scores of the positions previously selected in relation to aligning the wafer image with the reference image, storing location information and the alignment score of the current lock position, and aligning the area enclosing the current lock position with the reference image using the current lock position.

In the inspection system, the aligning of the image with a reference image based on the comparison may further include: in response to a determination that the alignment score of the current lock position is lower than the alignment scores of the positions previously selected in relation to aligning the image with the reference image, selecting a highest alignment score among the stored alignment scores, and aligning the area enclosing the current lock position with the reference image using a lock position corresponding to the highest alignment score.

In the inspection system, the controller having circuitry is further for: in response to determining that the targeted reference position exists, defining an area surrounding the targeted reference position on the wafer, and aligning the area surrounding the targeted reference position with the reference using the targeted reference position.

Now referring back to FIG. 2, storage medium 206 may be a non-transitory computer readable medium storing a set of instructions that is executable by a controller of a device to cause the device to perform a method comprising: searching for a targeted reference position on an image of a wafer; and in response to determining that the targeted reference position does not exist: defining a current lock position and an area enclosing the current lock position on the image of the wafer; computing an alignment score of the current lock position; comparing the alignment score of the current lock position with stored alignment scores of positions previously selected in relation to aligning the wafer image with a reference image; and aligning the image with the reference image based on the comparison.

In the non-transitory computer readable medium, the aligning of the image with a reference image based on the comparison may further include: in response to a determination that the alignment score of the current lock position is higher than the stored alignment scores of the positions previously selected in relation to aligning the image with a reference image, storing location information and the alignment score of the current lock position, and aligning the area enclosing the current lock position with the reference image using the current lock position.

In the non-transitory computer readable medium, the aligning of the image with a reference image based on the comparison may further include: in response to a determination that the alignment score of the current lock position is lower than the alignment scores of the positions previously selected in relation to aligning the image with the reference image, selecting a highest alignment score among the stored alignment scores, and aligning the area enclosing the current lock position with the reference image using a lock position corresponding to the highest alignment score.

In the non-transitory computer readable medium, the set of instructions that is executable by the controller of the device may cause the device to further perform: in response to determining that the targeted reference position exists, defining an area surrounding the targeted reference position on the wafer, and aligning the area surrounding the targeted reference position with the reference image using the targeted reference position.

The embodiments may further be described using the following clauses:

1. A method for aligning a wafer image with a reference image, comprising:
   searching for a targeted reference position in a database for aligning the wafer image with the reference image; and
   in response to a determination that the targeted reference position does not exist in the database:
      identifying a current lock position and an area that encloses the current lock position on the wafer image;
      computing an alignment score of the current lock position;
      comparing the alignment score of the current lock position with stored alignment scores of positions previously selected in relation to aligning the wafer image with the reference image; and
      aligning the wafer image with the reference image based on the comparison.

2. The method of clause 1, wherein aligning the wafer image with the reference image based on the comparison further comprises:
   in response to a determination that the alignment score of the current lock position satisfies a threshold condition:
      storing location information and the alignment score of the current lock position at the database to facilitate a determination of a targeted reference position; and
      aligning the area enclosing the current lock position with the reference image using the current lock position.

3. The method of clause 2, wherein the alignment score of the current lock position satisfies the threshold condition when the alignment score of the current lock position is higher than the stored alignment scores of positions that are located within the area enclosing the current lock position, the positions that are located within the area enclosing the current lock position being the positions previously selected in relation to aligning the wafer image with the reference image.

4. The method of clause 1, wherein aligning the wafer image with the reference image based on the comparison further comprises:
   in response to a determination that the alignment score of the current lock position does not satisfy a threshold condition:
      selecting a highest alignment score among the stored alignment scores; and
      aligning the area enclosing the current lock position with the reference image using a lock position corresponding to the highest alignment score.

5. The method of clause 4, wherein the threshold condition is not satisfied when the alignment score of the current lock position is lower than the stored alignment scores of positions that are located within the area enclosing the current lock position, the positions that are located within the area enclosing the current lock position being the positions previously selected in relation to aligning the wafer image with the reference image.

6. The method of any one of clauses 4 to 5, wherein the lock position corresponding to the highest alignment score is a location that is in a field of view and that is different than the current lock position.

7. The method of any one of clauses 1 to 6, wherein the area enclosing the current lock position is a field of view.

8. The method of any one of clauses 1 to 6, wherein the area enclosing the current lock position is a portion of a field of view.

9. The method of any one of clauses 1 to 8, wherein the alignment score of the current lock position and the stored alignment scores are determined based on a sum of squared differences in intensity:

$$SSD = \sum_i (p_i - q_i)^2$$

where $p_i$ and $q_i$ denote pixel intensity values of a wafer image and a reference image, respectively.

10. The method of any one of clauses 1 to 8, wherein the alignment score of the current lock position and the stored alignment scores are determined based on correlation coefficients between two images:

$$r = \frac{\sum_i (p_i - \overline{p})(q_i - \overline{q})}{\sqrt{\sum_i (p_i - \overline{p})^2} \sqrt{\sum_i (q_i - \overline{q})^2}}$$

where $p_i$ and $q_i$ denote pixel intensity values of a wafer image and a reference image, respectively, and $\overline{p}$ and $\overline{q}$ denote mean intensity values of the wafer image and the reference image, respectively.

11. The method of any one of clauses 1 to 10, wherein a size of the area enclosing the current lock position and a size of the area surrounding the targeted reference position is within millimeter to nanometer scale.

12. The method of any one of clauses 1 to 11, wherein the current lock position is defined based on a comparison of numbers of features existing at different regions of the wafer.

13. The method of any one of clauses 1 to 11, wherein the current lock position is defined based on a comparison of numbers of pattern edges existing at different regions of the wafer.

14. The method of any one of clauses 1 to 13, wherein the current lock position is located substantially at a center of the area enclosing the current lock position of the wafer.

15. The method of clause 2, wherein the determination of the targeted reference position further comprises:
   identifying the current lock position as the targeted reference position.

16. The method of clause 15, wherein the identifying of the targeted reference position is based on a comparison between a total number of times a position has been selected as a lock position in prior alignments and a threshold number.

17. The method of clause 16, wherein the threshold number is 20.

18. The method of any one of clauses 1 to 17, wherein the reference image comprises a graphic data system (GDS).

19. The method of clause 1 to 18, wherein the reference image is an image of a different wafer.

20. An electron beam inspection apparatus, comprising:
   a controller having circuitry to cause the electron beam inspection apparatus to perform:
      searching for a targeted reference position in a database; and
      in response to a determination that the targeted reference position does not exist in the database:
         defining a current lock position and an area enclosing the current lock position on the wafer image;
         computing an alignment score of the current lock position;
         comparing the alignment score of the current lock position with stored alignment scores of positions previously selected in relation to aligning the wafer image with the reference image; and
         aligning the wafer image with a reference image based on the comparison.

21. The electron beam inspection apparatus of clause 20, wherein aligning the wafer image with a reference image based on the comparison further includes:
   in response to a determination that the alignment score of the current lock position satisfies a threshold condition:
      storing location information and the alignment score of the current lock position at the database to facilitate a determination of a targeted reference position; and
      aligning the area enclosing the current lock position with the reference image using the current lock position.

22. The electron beam inspection apparatus of clause 20, wherein aligning the wafer image with a reference image based on the comparison further includes:
   in response to a determination that the alignment score of the current lock position does not satisfy a threshold condition:
      selecting a highest alignment score among the stored alignment scores; and
      aligning the area enclosing the current lock position with the reference image using a lock position corresponding to the highest alignment score.

23. A non-transitory computer readable medium storing a set of instructions that is executable by a controller of a device to cause the device to perform a method comprising:
- searching for a targeted reference position in a database; and
- in response to a determination that the targeted reference position does not exist in the database:
  - defining a current lock position and an area enclosing the current lock position on the wafer image;
  - computing an alignment score of the current lock position;
  - comparing the alignment score of the current lock position with stored alignment scores of positions previously selected in relation to aligning the wafer image with a reference image; and
  - aligning the wafer image with the reference image based on the comparison.

24. The non-transitory computer readable medium of clause 23, wherein aligning the wafer image with a reference image based on the comparison further includes:
- in response to a determination that the alignment score of the current lock position satisfies a threshold condition:
  - storing location information and the alignment score of the current lock position at the database to facilitate a determination of a targeted reference position; and
  - aligning the area enclosing the current lock position with the reference image using the current lock position.

25. The non-transitory computer readable medium of clause 23, wherein aligning the wafer image with a reference image based on the comparison further includes:
- in response to a determination that the alignment score of the current lock position does not satisfy a threshold condition:
  - selecting a highest alignment score among the stored alignment scores; and
  - aligning the area enclosing the current lock position with the reference image using a lock position corresponding to the highest alignment score.

26. The method of clause 1,
- wherein the positions previously selected in relation to aligning the wafer image with the reference image include:
  - positions that are located within the area enclosing the current lock position being a first portion of the positions previously selected; or
  - positions that are not located within the area enclosing the current lock position being a second portion of the positions previously selected.

27. The method of clause 26,
- wherein the positions previously selected in relation to aligning the wafer image with the reference image including
  - the positions that are located within the area enclosing the current lock position being the first portion of the positions previously selected or
  - the positions that are not located within the area enclosing the current lock position being the second portion of the positions previously selected
  further includes:
  - the positions that are located within the area enclosing the current lock position being the first portion of the positions previously selected; and
  - the positions that are not located within the area enclosing the current lock position being the second portion of the positions previously selected.

28. The method of clause 27, wherein the first portion is one or more of the positions previously selected, and wherein the second portion is one or more of the positions previously selected.

29. The method of clause 26, wherein the first portion is none of the positions previously selected, and wherein the second portion is all of the positions previously selected.

30. The method of clause 26, wherein the first portion is all of the positions previously selected, and wherein the second portion is none of the positions previously selected.

Example embodiments are described above with reference to flowchart illustrations or block diagrams of methods, apparatus (systems) and computer program products. It will be understood that each block of the flowchart illustrations or block diagrams, and combinations of blocks in the flowchart illustrations or block diagrams, can be implemented by computer program product or instructions on a computer program product. These computer program instructions may be provided to a processor of a computer, or other programmable data processing apparatus to produce a machine, such that the instructions, which execute via the processor of the computer or other programmable data processing apparatus, create means for implementing the functions/acts specified in the flowchart or block diagram block or blocks.

These computer program instructions may also be stored in a computer readable medium that can direct a hardware processor core of a computer, other programmable data processing apparatus, or other devices to function in a particular manner, such that the instructions stored in the computer readable medium form an article of manufacture including instructions which implement the function/act specified in the flowchart or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart or block diagram block or blocks.

Any combination of one or more computer readable medium(s) may be utilized. The computer readable medium may be a non-transitory computer readable storage medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM, EEPROM or Flash memory), an optical fiber, a cloud storage, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Program code embodied on a computer readable medium may be transmitted using any appropriate medium, including but not limited to wireless, wireline, optical fiber cable, RF, IR, etc., or any suitable combination of the foregoing.

Computer program code for carrying out operations for example embodiments may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate examples of the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" mean that a particular feature, structure, or characteristic described in connection with the embodiment can be included in at least one embodiment. The appearance of the phrases "one embodiment" "some embodiments" or "some exemplary embodiments" in various places in the specification do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. Likewise, additional steps may be included in such methods, and certain steps may be omitted or combined, in methods consistent with various embodiments.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

Additionally, the articles "a" and "an" as used in this application and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

The use of figure numbers or figure reference labels in the claims is intended to identify one or more possible embodiments of the claimed subject matter to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

It will be further understood that various changes in the details, materials, and arrangements of the parts which have been described and illustrated in order to explain the nature of described embodiments may be made by those skilled in the art without departing from the scope as expressed in the following claims.

The invention claimed is:

1. An inspection apparatus, comprising:
 a controller having circuitry to cause the inspection apparatus to perform:
  searching for a reference position in a database; and
  in response to a determination that the reference position does not exist in the database:
   defining a current lock position and an area enclosing the current lock position on a wafer image;
   computing an alignment score of the current lock position;
   comparing the alignment score of the current lock position with stored alignment scores; and
   aligning the wafer image with a reference image based on the comparing.

2. The inspection apparatus of claim 1, wherein aligning the wafer image with a reference image based on the comparing further comprises:
 in response to a determination that the alignment score of the current lock position satisfies a threshold condition:
  storing location information and the alignment score of the current lock position at the database to facilitate a determination of a reference position; and
  aligning the area enclosing the current lock position with the reference image using the current lock position.

3. The inspection apparatus of claim 2, wherein the alignment score of the current lock position satisfies the threshold condition when the alignment score of the current lock position is higher than the stored alignment scores of positions that are located within the area enclosing the current lock position, the positions that are located within the area enclosing the current lock position being positions previously selected in relation to aligning the wafer image with the reference image.

4. The inspection apparatus of claim 1, wherein aligning the wafer image with a reference image based on the comparing further comprises:
 in response to a determination that the alignment score of the current lock position does not satisfy a threshold condition:
  selecting a highest alignment score among the stored alignment scores; and aligning the area enclosing the current lock position with the reference image using a lock position corresponding to the highest alignment score.

5. The inspection apparatus of claim 4, wherein the threshold condition is not satisfied when the alignment score of the current lock position is lower than the stored alignment scores of positions that are located within the area enclosing the current lock position, the positions that are located within the area enclosing the current lock position being positions previously selected in relation to aligning the wafer image with the reference image.

6. The inspection apparatus of claim 4, wherein the lock position corresponding to the highest alignment score is a location that is in a field of view and that is different than the current lock position.

7. The inspection apparatus of claim 1, wherein the area enclosing the current lock position is a field of view.

8. The inspection apparatus of claim 1, wherein the area enclosing the current lock position is a portion of a field of view.

9. The inspection apparatus of claim 1, wherein the alignment score of the current lock position and the stored alignment scores are determined based on a sum of squared differences in intensity:

$$SSD = \sum_i (p_i - q_i)^2$$

where $p_i$, $q_i$ denote pixel intensity values of a wafer image and a reference image, respectively.

10. The inspection apparatus of claim 1, wherein the alignment score of the current lock position and the stored alignment scores are determined based on correlation coefficients between two images:

$$r = \frac{\sum_i (p_i - \overline{p})(q_i - \overline{q})}{\sqrt{\sum_i (p_i - \overline{p})^2} \sqrt{\sum_i (q_i - \overline{q})^2}}$$

where $p_i$ and $q_i$ denote pixel intensity values of the wafer image and the reference image, respectively, and $\overline{p}$ and $\overline{q}$ denote mean intensity values of the wafer image and the reference image, respectively, and r is a correlation coefficient.

11. The inspection apparatus of claim 1, wherein a size of the area enclosing the current lock position and a size of an area surrounding the reference position is within millimeter to nanometer scale.

12. The inspection apparatus of claim 1, wherein the current lock position is defined based on a comparison of numbers of features existing at different regions of a wafer corresponding to the wafer image.

13. The inspection apparatus of claim 1, wherein the current lock position is defined based on a comparison of numbers of pattern edges existing at different regions of a wafer corresponding to the wafer image.

14. The inspection apparatus of claim 1, wherein the current lock position is located substantially at a center of the area enclosing the current lock position of a wafer corresponding to the wafer image.

15. A non-transitory computer readable medium storing a set of instructions that is executable by a controller of a device to cause the device to perform a method comprising:
    searching for a reference position in a database; and
    in response to a determination that the reference position does not exist in the database:
    defining a current lock position and an area enclosing the current lock position on a wafer image;
    computing an alignment score of the current lock position;
    comparing the alignment score of the current lock position with stored alignment scores; and
    aligning the wafer image with the reference image based on the comparing.

16. The non-transitory computer readable medium of claim 15, wherein aligning the wafer image with a reference image based on the comparing further comprises:
    in response to a determination that the alignment score of the current lock position satisfies a threshold condition:
        storing location information and the alignment score of the current lock position at the database to facilitate a determination of a reference position; and
        aligning the area enclosing the current lock position with the reference image using the current lock position.

17. The non-transitory computer readable medium of claim 16, wherein the alignment score of the current lock position satisfies the threshold condition when the alignment score of the current lock position is higher than the stored alignment scores of positions that are located within the area enclosing the current lock position, the positions that are located within the area enclosing the current lock position being positions previously selected in relation to aligning the wafer image with the reference image.

18. The non-transitory computer readable medium of claim 15, wherein aligning the wafer image with a reference image based on the comparing further comprises:
    in response to a determination that the alignment score of the current lock position does not satisfy a threshold condition:
        selecting a highest alignment score among the stored alignment scores; and
        aligning the area enclosing the current lock position with the reference image using a lock position corresponding to the highest alignment score.

19. The non-transitory computer readable medium of claim 18, wherein the threshold condition is not satisfied when the alignment score of the current lock position is lower than the stored alignment scores of positions that are located within the area enclosing the current lock position, the positions that are located within the area enclosing the current lock position being positions previously selected in relation to aligning the wafer image with the reference image.

20. The non-transitory computer readable medium of claim 18, wherein the lock position corresponding to the highest alignment score is a location that is in a field of view and that is different than the current lock position.

* * * * *